(12) United States Patent
Hirabayashi (10) Patent No.: US 9,183,905 B2
(45) Date of Patent: Nov. 10, 2015

(54) DELAY CIRCUIT AND SEMICONDUCTOR MEMORY DEVICE

(71) Applicant: Kabushiki Kaisha Toshiba, Minato-ku, Tokyo (JP)

(72) Inventor: Osamu Hirabayashi, Tokyo (JP)

(73) Assignee: Kabushiki Kaisha Toshiba, Minato-Ku, Tokyo (JP)

( * ) Notice: Subject to any disclaimer, the term of this patent is extended or adjusted under 35 U.S.C. 154(b) by 69 days.

(21) Appl. No.: 14/201,592

(22) Filed: Mar. 7, 2014

(65) Prior Publication Data

US 2014/0376319 A1 Dec. 25, 2014

(30) Foreign Application Priority Data

Jun. 25, 2013 (JP) .................................. 2013-132938

(51) Int. Cl.
| | |
|---|---|
| *G11C 7/22* | (2006.01) |
| *G11C 11/419* | (2006.01) |
| *G11C 7/08* | (2006.01) |
| *G11C 7/04* | (2006.01) |

(52) U.S. Cl.
CPC ................ *G11C 7/22* (2013.01); *G11C 11/419* (2013.01); *G11C 7/04* (2013.01); *G11C 7/08* (2013.01)

(58) Field of Classification Search
CPC ............ G11C 7/22; G11C 7/222; G11C 7/04; G11C 7/08; G11C 8/18; G11C 11/419; H03K 17/687

USPC ............... 365/194, 154, 190, 233.1; 327/281; 713/401

See application file for complete search history.

(56) References Cited

U.S. PATENT DOCUMENTS

| | | | | |
|---|---|---|---|---|
| 5,532,969 | A | * | 7/1996 | Houghton et al. ........ 365/185.16 |
| 7,486,113 | B2 | | 2/2009 | Masuo et al. |
| 7,528,641 | B2 | | 5/2009 | Kuramori |
| 7,656,197 | B2 | | 2/2010 | Masuo et al. |
| 8,400,821 | B2 | | 3/2013 | Tachibana |
| 2006/0152262 | A1 | * | 7/2006 | Park .............................. 327/172 |
| 2007/0046354 | A1 | | 3/2007 | Kuroki et al. |

FOREIGN PATENT DOCUMENTS

| | | |
|---|---|---|
| JP | 2007-043661 A | 2/2007 |
| JP | 2007-067819 A | 3/2007 |
| JP | 2007-164922 A | 6/2007 |
| JP | 2009-089349 A | 4/2009 |
| JP | 2012-113769 A | 6/2012 |

* cited by examiner

*Primary Examiner* — Tan T. Nguyen
(74) *Attorney, Agent, or Firm* — White & Case LLP (57) ABSTRACT

According to an embodiment, a load adjusting circuit adjusts the load of an inverter circuit based on a threshold voltage of a first conductive type transistor provided on the inverter circuit, and a driving force adjusting circuit adjusts the driving force of the inverter circuit based on the threshold voltage of the first conductive type transistor.

20 Claims, 8 Drawing Sheets

|  | DELAY IS NOT COMPENSATED | | DELAY IS COMPENSATED | |
|---|---|---|---|---|
|  | Vf (NORMALIZED) | tac (NORMALIZED) | Vf (NORMALIZED) | tac (NORMALIZED) |
| SS_-40 | 1.13 | 1.00 | 0.98 | 0.94 |
| SF_-40 | 1.00 | 0.78 | 0.98 | 0.77 |
| FS_-40 | 1.84 | 0.77 | 1.45 | 0.70 |
| FF_-40 | 1.68 | 0.58 | 1.46 | 0.55 |
| SS_125 | 1.23 | 0.91 | 1.08 | 0.86 |
| SF_125 | 1.12 | 0.76 | 1.05 | 0.74 |
| FS_125 | 1.55 | 0.74 | 1.19 | 0.68 |
| FF_125 | 1.65 | 0.60 | 1.42 | 0.57 |

DELAY CIRCUIT AND SEMICONDUCTOR MEMORY DEVICE

CROSS-REFERENCE TO RELATED APPLICATIONS

This application is based upon and claims the benefit of priority from Japanese Patent Application No. 2013-132938, filed on Jun. 25, 2013; the entire contents of which are incorporated herein by reference.

FIELD

Embodiments described herein relate generally to a delay circuit and a semiconductor memory device.

BACKGROUND

In a semiconductor memory device, a sense amplifier is activated after the potential of a bit line reaches a potential enough to define the output of the sense amplifier when reading data. In the activation, a margin for the timing of activating the sense amplifier is set in such a way that variations in the characteristic of a transistor for use in the sense amplifier are absorbed.

DETAILED DESCRIPTION

In general, according to one embodiment, a load adjusting circuit and a driving force adjusting circuit are provided. The load adjusting circuit adjusts the load of an inverter circuit based on the threshold voltage of a first conductive type transistor provided on the inverter circuit. The driving force adjusting circuit adjusts the driving force of the inverter circuit based on the threshold voltage of the first conductive type transistor.

In the following, a semiconductor memory device according to embodiments will be described in detail with reference to the accompanying drawings. It is noted that the present invention is not limited to these embodiments.

First Embodiment

Figure 1:
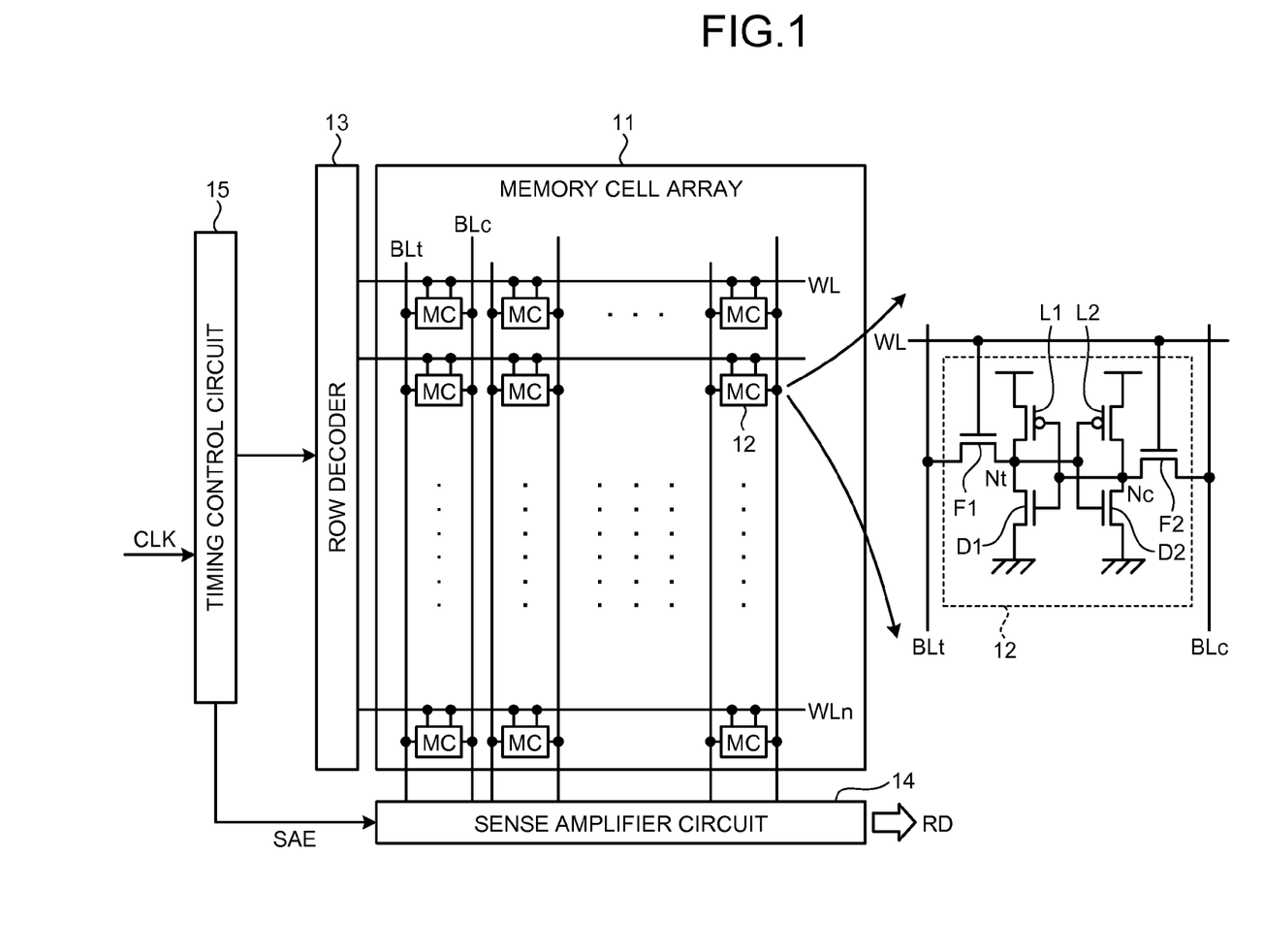
FIG. 1 is a block diagram of the schematic configuration of a semiconductor memory device according to a first embodiment.

FIG. 1 is a block diagram of the schematic configuration of a semiconductor memory device according to a first embodiment.

In FIG. 1, a semiconductor memory device is provided with a memory cell array 11, a row decoder 13, a sense amplifier circuit 14, and a timing control circuit 15.

Here, on the memory cell array 11, memory cells 12 are arranged in a matrix configuration in the row direction and the column direction. It is noted that the memory cell 12 can complementarily store data, and can configure an SRAM, for example.

The memory cell array 11 is provided with a word line WL that transmits a signal to select a row of the memory cell 12. Moreover, the memory cell array 11 is provided with bit lines BLt and BLc that complementarily transmit signals read out of the memory cell 12.

The memory cells 12 on the same rows are connected to each other through the respective word lines WL. Furthermore, the memory cells 12 on the same columns are connected to each other through the respective bit lines BLt and BLc. It is noted that in reading/writing data to the memory cell 12, the bit lines BLt and BLc can complementarily operate to each other. For example, in reading/writing data to the memory cell 12, the bit line BLc can be set at low level when the bit line BLt is set at high level, whereas the bit line BLc can be set at high level when the bit line BLt is set at low level. It is noted that both of the bit lines BLt and BLc are precharged at high level in standby.

Here, the memory cell 12 is provided with a pair of drive transistors D1 and D2, a pair of load transistors L1 and L2, and a pair of transmission transistors F1 and F2. It is noted that P-channel field effect transistors can be used for the load transistors L1 and L2 and N-channel field effect transistors can be used for the drive transistors D1 and D2 and the transmission transistors F1 and F2.

The drive transistor D1 and the load transistor L1 are connected to each other in series, so that a CMOS inverter is configured, and the drive transistor D2 and the load transistor L2 are connected to each other in series, so that a CMOS inverter is configured. The outputs and inputs of a pair of the CMOS inverters are in cross coupling to each other, so that a flip-flop is configured. The word line WL is connected to the gates of the transmission transistors F1 and F2.

Here, the connecting point between the drain of the drive transistor D1 and the drain of the load transistor L1 can configure a storage node Nt, and the connecting point between the drain of the drive transistor D2 and the drain of the load transistor L2 can configure a storage node Nc.

Moreover, the bit line BLt is connected to the storage node Nt through the transmission transistor F1. Furthermore, the bit line BLc is connected to the storage node Nc through the transmission transistor F2.

The row decoder 13 can select a row of the memory cell 12 specified by a row address. The sense amplifier circuit 14 can detect data stored on the memory cell 12 based on the signals read out of the memory cell 12 to the bit lines BLt and BLc.

Figure 2:
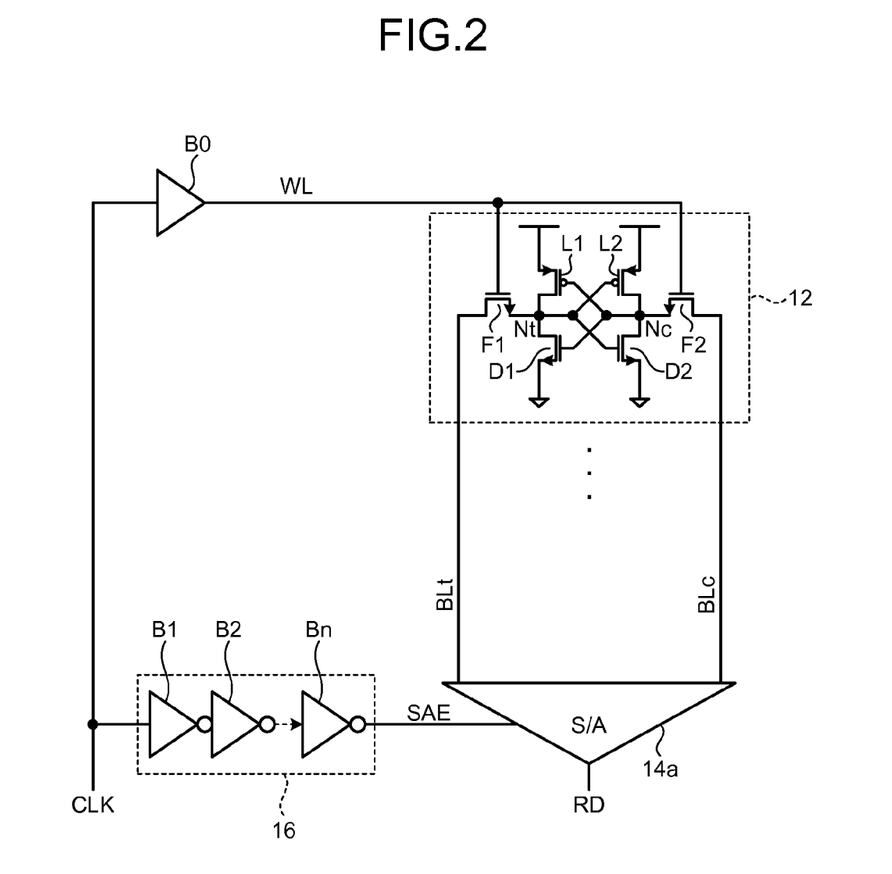
FIG. 2 is a block diagram of one column extracted from the semiconductor memory device in FIG. 1.

FIG. 2 is a block diagram of one column extracted from the semiconductor memory device in FIG. 1.

In FIG. 2, the sense amplifier circuit 14 is provided with a sense amplifier 14a for individual columns to detect signals transmitted through the bit lines BLt and BLc. The timing control circuit 15 is provided with a delay circuit 16 that delays a clock signal CLK to generate a sense amplifier enable signal SAE. The delay circuit 16 is provided with inverter circuits B1 to Bn connected in 2n stages (n is a positive integer). The row decoder 13 is provided with a buffer B0 that drives the word line WL based on the clock signal CLK.

Figure 3:
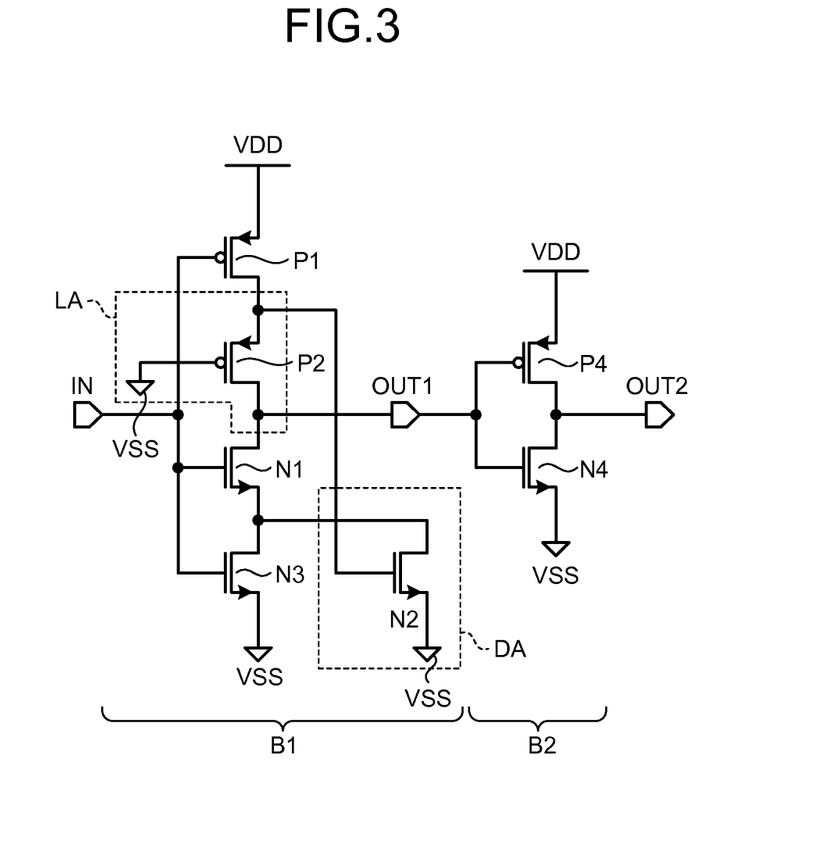
FIG. 3 is a circuit diagram of an exemplary configuration of a delay circuit in FIG. 2.

FIG. 3 is a circuit diagram of an exemplary configuration of the delay circuit in FIG. 2. It is noted that in the example in FIG. 3, the case is illustrated where the delay circuit 16 is configured using the inverter circuits B1 and B2 in two stages.

In FIG. 3, the inverter circuit B1 is provided with a load adjusting circuit LA and a driving force adjusting circuit DA. The load adjusting circuit LA is provided with a P-type transistor P2. The driving force adjusting circuit DA is provided with an N-type transistor N2. The load adjusting circuit LA can adjust a load in the pulldown of the inverter circuit B1 based on the threshold voltage of the P-type transistor P2. The driving force adjusting circuit DA can adjust the driving force (the capability of carrying an electric current) of the inverter circuit B1 based on the threshold voltage of the P-type transistor P2.

The gate potential of the P-type transistor P2 is set so as to adjust the load charge amount of the inverter circuit B1, and the P-type transistor P2 can output an output signal OUT1 of the inverter circuit B1 from the drain. The source potential of the P-type transistor P2 is inputted to the gate of the N-type transistor N2. A P-type transistor P1 is connected in series to the source side of the P-type transistor P2, and the source of the P-type transistor P1 is set at a first potential VDD. An N-type transistor N1 is connected in series to the drain side of the P-type transistor P2, an N-type transistor N3 is connected in series to the source side of the N-type transistor N1, and the sources of the N-type transistors N2 and N3 are set at a second potential VSS. It is noted that the first potential VDD can be set higher than the second potential VSS. For example, the first potential VDD can be set at a power supply potential, and the second potential VSS can be set to a ground potential. The gate of the P-type transistor P2 can be set at the second potential VSS. An input signal IN of the inverter circuit B1 is inputted to the gates of the P-type transistor P1 and the N-type transistors N1 and N3.

The inverter B2 is provided with a P-type transistor P4 and an N-type transistor N4. The P-type transistor P4 and the N-type transistor N4 are connected to each other in series. The source of the P-type transistor P4 is set at the first potential VDD, and the source of the N-type transistor N4 is set at the second potential VSS. The output signal OUT1 of the inverter circuit B1 is inputted to the gates of the P-type transistor P4 and the N-type transistor N4. An output signal OUT2 of the inverter circuit B2 is outputted from the drain of the P-type transistor P4.

In the case where the input signal IN is at low level, the P-type transistor P1 is turned on, and the N-type transistors N1 and N3 are turned off. Thus, the source potential of the P-type transistor P2 is set at the first potential VDD. Moreover, since the gate potential of the P-type transistor P2 is set at the second potential VSS, the P-type transistor P2 is turned on, and the output signal OUT1 of the inverter B1 is turned at high level. The output signal OUT1 of the inverter B1 is then inverted at the inverter B2, and the output signal OUT2 of the inverter B2 is turned at low level.

When the input signal IN rises from low level to high level, the P-type transistor P1 is turned off, and the N-type transistors N1 and N3 are turned on. Thus, the drain potential of the P-type transistor P2 is pulled down through the N-type transistors N1 and N3, and the output signal OUT1 of the inverter B1 is turned at low level. The output signal OUT1 of the inverter B1 is then inverted at the inverter B2, and the output signal OUT2 of the inverter B2 is turned at high level. Here, since the gate potential of the P-type transistor P2 is set at the second potential VSS, the P-type transistor P2 is turned on, and a charge amount q is discharged from the source of the P-type transistor P2 to the drain. The charge amount q can be given by q=C (VDD−Vtp), where the capacitance of a source node of the P-type transistor P2 is C, the threshold voltage of the P-type transistor P2 is Vtp, and the second potential VSS is the ground potential. Thus, when the threshold voltage Vtp of the P-type transistor P2 is low, the charge amount q discharged in the pulldown of the inverter B1 is increased, and the load of the inverter B1 is increased. As a result, when the threshold voltages Vtp of the P-type transistors P1 and P2 are reduced, the load in the pulldown of the inverter B1 can be increased, the dependence of the delay time of the inverter B1 on characteristic fluctuations of the P-type transistors P1 and P2 can be reduced, whereas the operations of the P-type transistors P1 and P2 become faster.

Moreover, since the gate potential of the N-type transistor N2 is set to the source potential of the P-type transistor P2, when the threshold voltage Vtp of the P-type transistor P2 is low, the gate potential of the N-type transistor N2 drops, and the driving force of the N-type transistor N2 is reduced. As a result, when the threshold voltages Vtp of the P-type transistors P1 and P2 are reduced, the driving force in the pulldown of the inverter B1 can be reduced, and the dependence of the delay time of the inverter B1 on characteristic fluctuations of the P-type transistors P1 and P2 can be reduced, whereas the operations of the P-type transistors P1 and P2 become faster.

Furthermore, the P-type transistor P1 is connected in series to the source side of the P-type transistor P2, so that the source and drain of the P-type transistor P2 can be pulled up through the P-type transistor P1 when the input signal IN is at low level. Thus, the source and drain of the P-type transistor P2 can be precharged when the input signal IN is at low level, and the circuit to precharge the source and drain of the P-type transistor P2 can be simplified.

In addition, the N-type transistor N1 is connected in series to the drain side of the P-type transistor P2, and the drain of the N-type transistor N2 is connected to the source of the N-type transistor N1, so that the timing of turning on the N-type transistor N2 can be determined based on the input signal IN. Thus, it is unnecessary to separately provide a circuit that determines the timing of turning on the N-type transistor N2, and the circuit configuration can be simplified.

Moreover, the N-type transistor N3 is connected in series to the source side of the N-type transistor N1, so that the inverter B1 can be pulled down through the N-type transistor N3 even in the case where it is difficult to turn on the N-type transistor N2 because the threshold voltages Vtp of the P-type transistors P1 and P2 drop too much.

It is noted that in the example in FIG. 3, a method is described in which the delay circuit is configured using the inverters B1 and B2 in two stages. However, the delay circuit may be configured using only the inverter B1, or the delay circuit may be configured by alternately connecting the inverters B1 and B2 to each other in a plurality of stages.

Figure 4:
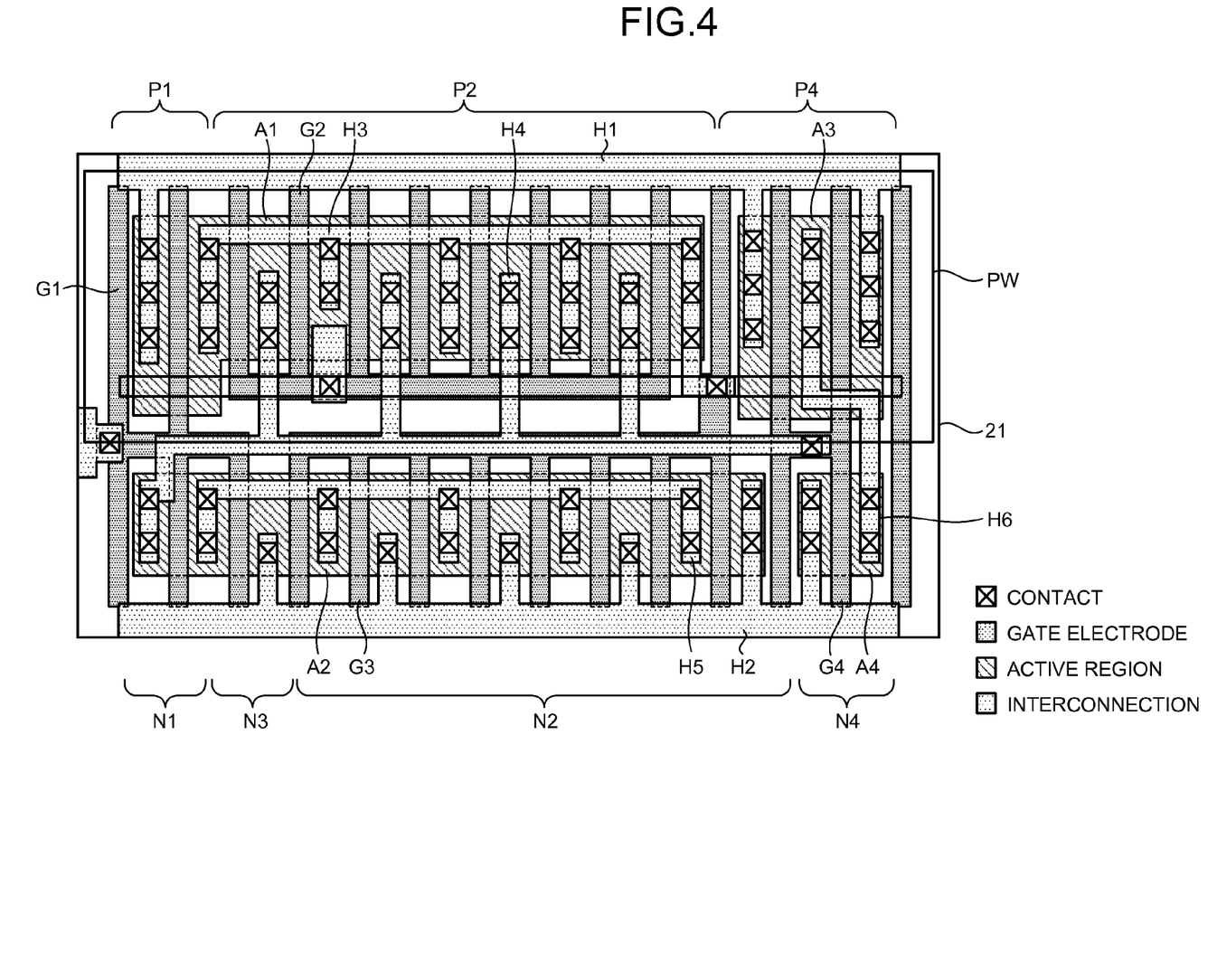
FIG. 4 is a plan view of an exemplary layout configuration of the delay circuit in FIG. 3.

FIG. 4 is a plan view of an exemplary layout configuration of the delay circuit in FIG. 3.

In FIG. 4, a P-well PW and active regions A2 and A4 are formed on a semiconductor substrate 21, and active regions A1 and A3 are formed on the P-well PW. Gate electrodes G1 and G2 are formed on the active region A1, gate electrodes G1 and G3 are formed on the active region A2, and a gate electrode G4 is formed on the active regions A3 and A4. It is noted that the active regions A1 to A4 can configure the source layer, the drain layer, and the channel layer of a transistor.

The active region A1 and the gate electrode G1 can configure the P-type transistor P1, the active region A1 and the gate electrode G2 can configure the P-type transistor P2, and the active region A3 and the gate electrode G4 can configure the P-type transistor P4. The active region A2 and the gate electrode G1 can configure the N-type transistors N1 and N3, the active region A2 and the gate electrode G3 can configure the N-type transistor N2, and the active region A4 and the gate electrode G4 can configure the N-type transistor N4.

The source layers of the P-type transistors P1 and P4 are connected to the first potential VDD through an interconnection H1. The source layers of the N-type transistors N2 to N4 are connected to the second potential VSS through an interconnection H2. The source layer of the P-type transistor P2 is connected to the gate electrode G3 through an interconnection H3. The drain layer of the P-type transistor P2 is connected to the drain layer of the N-type transistor N1 through an interconnection H4. The drain layer of the N-type transistor N2 is connected to the source layer of the N-type transistor N1 and the drain layer of the N-type transistor N3 through an interconnection H5. The drain layer of the P-type transistor P4 is connected to the drain layer of the N-type transistor N4 through an interconnection H6.

Figure 5:
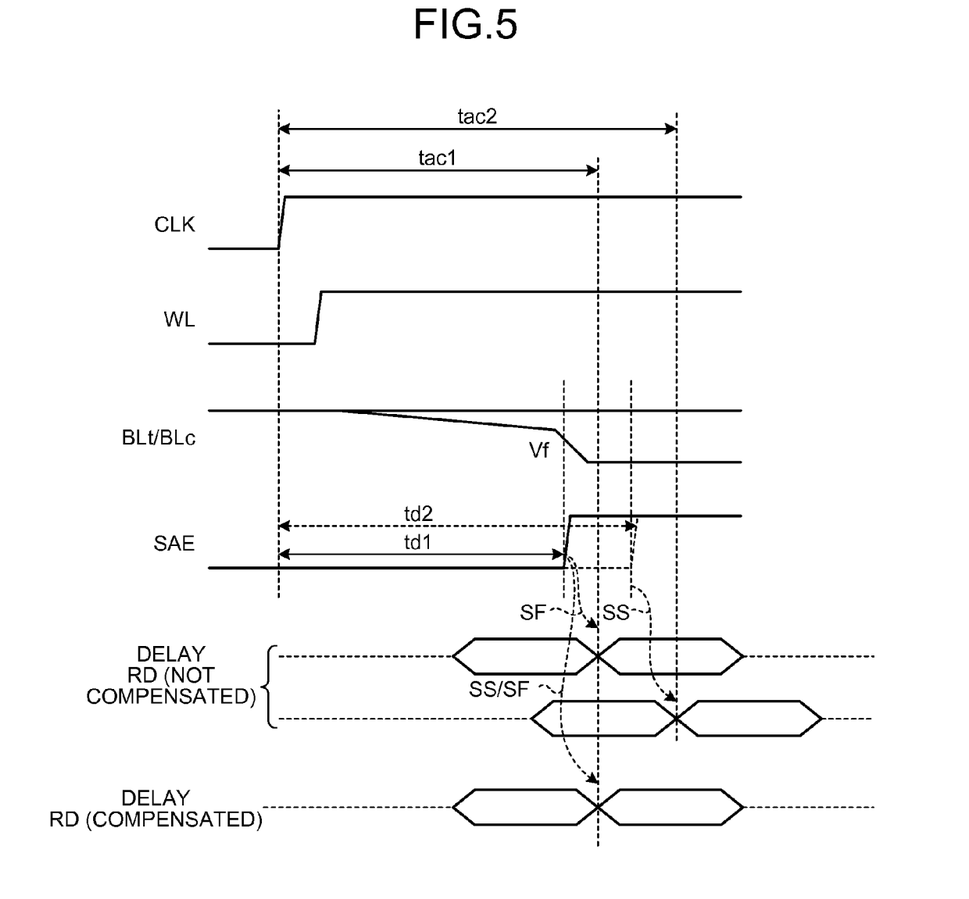
FIG. 5 is a timing chart of the voltage waveforms of respective components included in the semiconductor memory device in FIG. 1 when reading data.

FIG. 5 is a timing chart of the voltage waveforms of respective components included in the semiconductor memory device in FIG. 1 when reading data.

In FIG. 5, both of the bit lines BLt and BLc are precharged at high level in standby. Moreover, before the clock signal CLK rises, the potential of the word line WL is set at low level, and the memory cell 12 is not selected. Moreover, before the clock signal CLK rises, the sense amplifier enable signal SAE is maintained at low level, and the sense amplifier circuit 14a is not activated.

In reading data, when the clock signal CLK rises, a word line WL on a row selected at the row decoder 13 rises to turn on the transmission transistor F1. At this time, it is supposed that 'zero' is stored on the storage node Nt of the selected cell and 'one' is stored on the storage node Nc, the bit line BLt on the selected column is in discharge through the drive transistor D1, and the potential of the bit line BLt is gradually reduced according to the driving force of the drive transistor D1. Thus, the voltage difference between the bit lines BLt and BLc is increased, and the voltage difference between the bit lines BLt and BLc reaches a lowest voltage Vf that can be detected at the sense amplifier circuit 14a.

Furthermore, when the clock signal CLK rises, the sense amplifier enable signal SAE rises according to the delay time of the delay circuit 16, and the sense amplifier circuit 14a is activated. At this time, when the sense amplifier circuit 14a is activated before the voltage difference between the bit lines BLt and BLc reaches the lowest voltage Vf, the sense amplifier circuit 14a makes a false detection. Thus, the delay time of the delay circuit 16 is set in such a way that the sense amplifier circuit 14a is activated after the voltage difference between the bit lines BLt and BLc reaches the lowest voltage Vf. Here, when the delay time of the delay circuit 16 is prolonged, the read rate is reduced although it can be reliably prevented that the sense amplifier circuit 14a makes a false detection. Thus, in order that correctness in detection at the sense amplifier circuit 14a is compatible with the rapidity in reading data, preferably, the delay time of the delay circuit 16 is set in such a way that the sense amplifier circuit 14a is activated immediately after the voltage difference between the bit lines BLt and BLc reaches the lowest voltage Vf. When the sense amplifier circuit 14a is activated, data on the selected cell is determined based on the voltage difference between the bit lines BLt and BLc, and the determined result is outputted as read data RD.

Here, since the bit lines BLt and BLc are in discharge through the transmission transistor F1 and the drive transistor D1 and through the transmission transistor F2 and the drive transistor D2, respectively, a time period for which the voltage difference between the bit lines BLt and BLc reaches the lowest voltage Vf is determined according to the characteristic of the N-type transistor of the memory cell 12, and the time period does not depend on characteristic fluctuations of the P-type transistor.

On the other hand, in the case where the configuration similar to the configuration of the inverter B2 is used for the configuration of the inverter B1 (in the case where a delay is not compensated), the delay time of the delay circuit 16 is determined according to the characteristics of the N-type transistor and the P-type transistor, and the delay time depends on characteristic fluctuations of both of the N-type transistor and the P-type transistor. Namely, delay time td2 under an SS condition is longer than delay time td1 under an SF condition. It is noted that the SS condition is the case where characteristics vary in such a way that the operations of the P-type transistor and the N-type transistor become slow, and the SF condition is the case where characteristics vary in such a way that the operation of the P-type transistor becomes faster and the operation of the N-type transistor becomes slow. As a result, the access time for which the clock signal CLK rises and then the lead data RD is outputted is different between the SF condition and the SS condition. Namely, access time tac2 under the SS condition is longer than access time tac1 under the SF condition. At this time, under the SS condition, since the sense amplifier circuit 14a is activated some time behind when the voltage difference between the bit lines BLt and BLc reaches the lowest voltage Vf, an extra margin is added to the timing of activating the sense amplifier circuit 14a, and the read rate of the sense amplifier circuit 14a is reduced.

On the other hand, in the case where the inverter B1 is used for the delay circuit 16 (in the case where a delay is compensated), the dependence of the delay time of the inverter B1 on characteristic fluctuations of the P-type transistor can be reduced. Thus, the delay time of the delay circuit 16 is determined according to the characteristic of the N-type transistor, and it can be prevented that the delay time of the delay circuit 16 depends on characteristic fluctuations of the P-type transistor. Namely, the delay time under the SS condition can be made equal to the delay time td1 under the SF condition, and the access time under the SS condition can be made equal to the access time tac1 under the SF condition. At this time, the sense amplifier circuit 14a can be activated immediately after the voltage difference between the bit lines BLt and BLc reaches the lowest voltage Vf also under the SS condition as similar to the SF condition, and an extra margin added to the timing of activating the sense amplifier circuit 14a can be reduced, so that the read rate of the sense amplifier circuit 14a can be improved.

It is noted that the inverter B1 is used for the delay circuit 16, so that it is made possible that the delay time of the delay circuit 16 is determined according to the characteristic of the N-type transistor of the delay circuit 16 as similar to the fact that the time period to reach the lowest voltage Vf is determined according to the characteristic of the N-type transistor of the memory cell 12. At this time, preferably, the characteristic of the N-type transistor is matched between the memory cell 12 and the delay circuit 16, and preferably, the threshold voltage of the N-type transistor of the delay circuit 16 and the threshold voltage of the N-type transistor of the memory cell 12 are equal to each other.

Figure 6A:
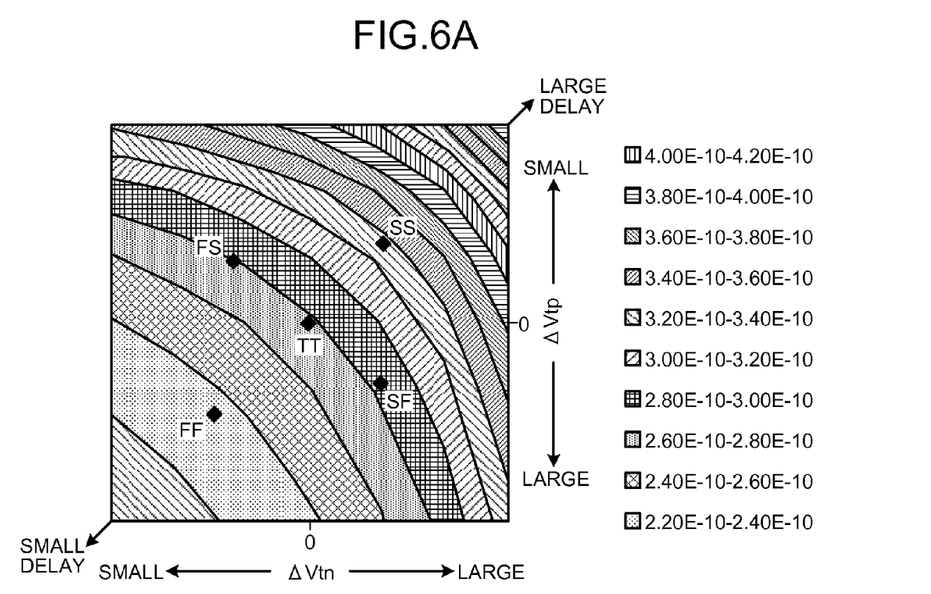
FIG. 6A is a diagram of the relationship between the threshold voltage and the delay amount before compensating a delay in the delay circuit in FIG. 3.
Figure 6B:
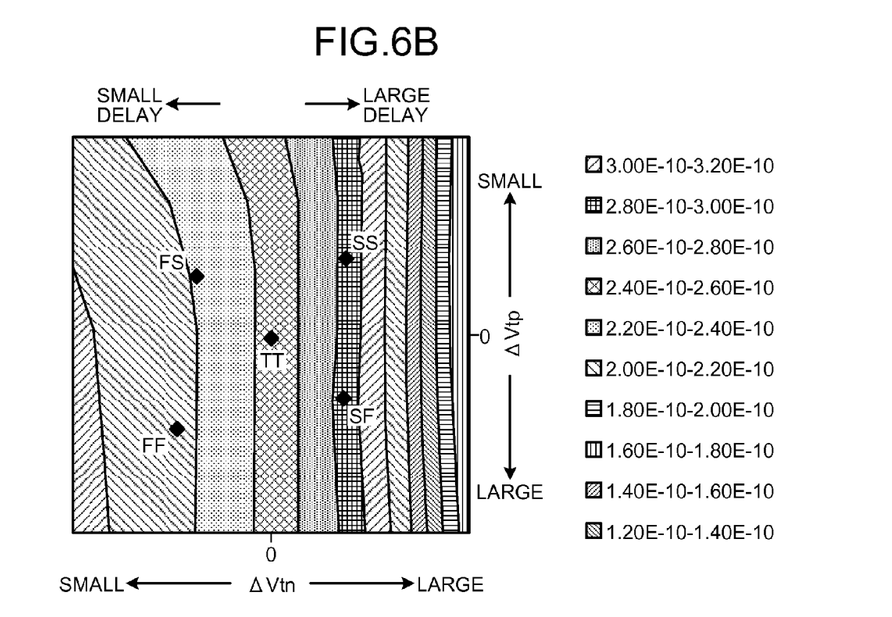
FIG. 6B is a diagram of the relationship between the threshold voltage and the delay amount after compensating a delay in the delay circuit in FIG. 3.

FIG. 6A is a diagram of the relationship between the threshold voltage and the delay amount before compensating a delay in the delay circuit in FIG. 3, and FIG. 6B is a diagram of the relationship between the threshold voltage and the delay amount after compensating a delay in the delay circuit in FIG. 3.

In FIG. 6A, in the case where a delay is not compensated at the delay circuit in FIG. 3, the delay time of the delay circuit fluctuates depending on characteristic fluctuations of the N-type transistor and the P-type transistor. It is noted that an FF condition is the case where characteristics vary in such a way that the operations of the P-type transistor and the N-type transistor become faster and an FS condition is the case where characteristics vary in such a way that the operation of the P-type transistor becomes slow and the operation of the N-type transistor becomes faster, and a TT condition is the case where the characteristics of the P-type transistor and the N-type transistor are typical characteristics. Moreover, ΔVtp expresses a change in the threshold of the P-type transistor, and ΔVtn expresses a change in the threshold of the N-type transistor.

On the other hand, in FIG. 6B, in the case where a delay is compensated at the delay circuit in FIG. 3, it can be prevented that the delay time of the delay circuit does not fluctuate even in the case where the characteristic of the P-type transistor fluctuates. Thus, it can be prevented that the rate of the delay time of the delay circuit is not limited under the SS condition, and the read rate of the sense amplifier circuit 14a can be improved.

Figure 7:
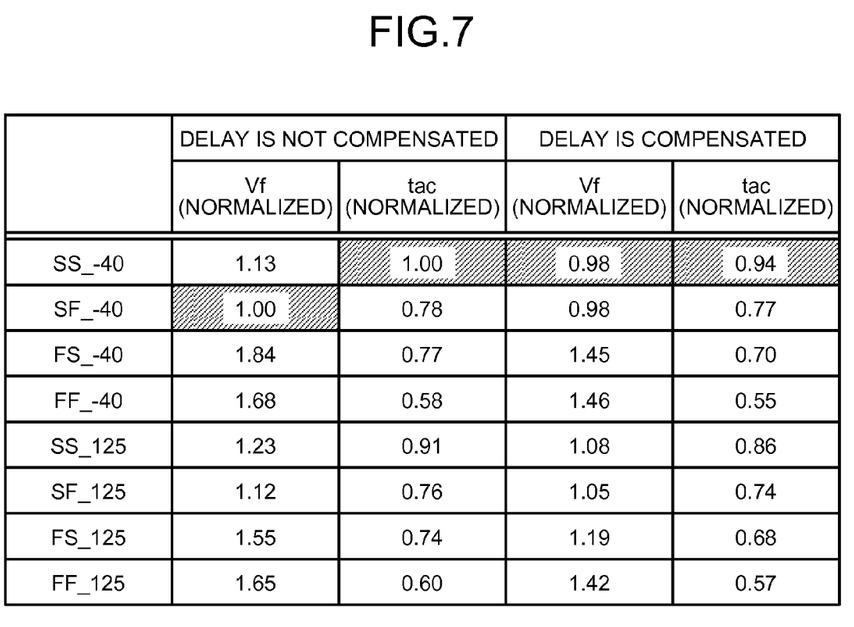
FIG. 7 is a diagram of the list of changes in the access time and the activation voltage before and after compensating a delay when changing the characteristics of the transistor of the delay circuit in FIG. 3 and operation conditions.

FIG. 7 is a diagram of the list of changes in the access time and the activation voltage before and after compensating a delay when changing the characteristics of the transistor of the delay circuit in FIG. 3 and operation conditions. It is noted that SS_−40, SF_−40, FS_−40, and FF_−40 express the cases where samples are operated at a temperature of −40□C under the SS condition, the SF condition, the FS condition, and the FF condition, respectively, and SS 125, SF 125, FS 125, and FF 125 express the cases where samples are operated at a temperature of 125□C under the SS condition, the SF condition, the FS condition, and the FF condition, respectively.

In FIG. 7, in the case where a delay is not compensated, the lowest voltage Vf is determined at SF_−40, whereas the access time tac is determined at SS_−40. It is supposed that the lowest voltage Vf is one at SF_−40, the lowest voltage Vf is 1.13 at SS_−40, and an extra margin is added at SS_−40.

On the other hand, in the case where a delay is compensated, the lowest voltage Vf and the access time tac are determined at SS_−40, and the access time tac can be reduced. Thus, the rate can be accelerated 0.94 times the case where a delay is not compensated.

Figure 8:
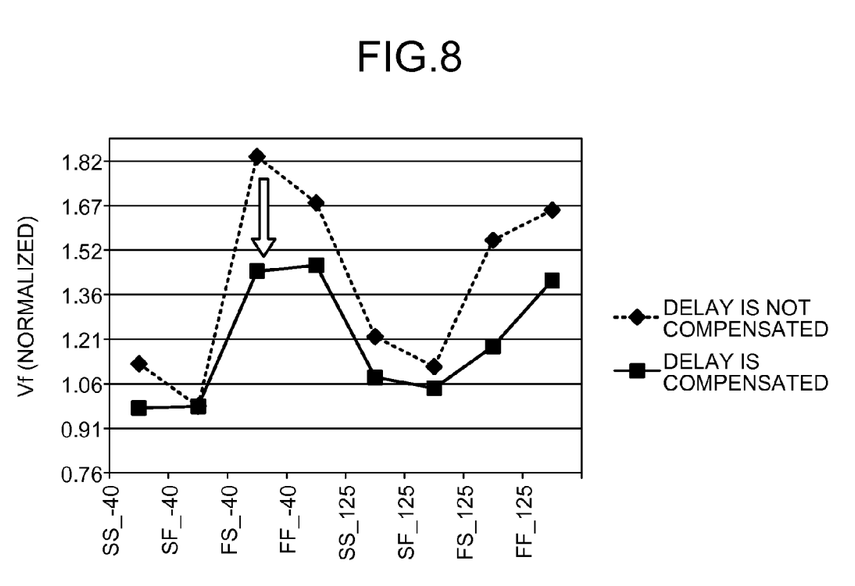
FIG. 8 is a graph that changes in the activation voltage are plotted before and after compensating a delay when changing the characteristics of the transistor of the delay circuit in FIG. 3 and operation conditions.

FIG. 8 is a graph that changes in the activation voltage are plotted before and after compensating a delay when changing the characteristics of the transistor of the delay circuit in FIG. 3 and operation conditions.

In FIG. 8, in the case where a delay is compensated, variations in the lowest voltage Vf with respect to variations in the operation condition can be relaxed as compared with the case where a delay is not compensated. Thus, voltage swings in the bit lines BLt and BLc in reading data can be reduced, and power consumption can be reduced. For example, at SF_−40, the voltage swings in the bit lines BLt and BLc can be reduced by 10 to 20%, and power consumption can be reduced accordingly.

Second Embodiment

Figure 9:
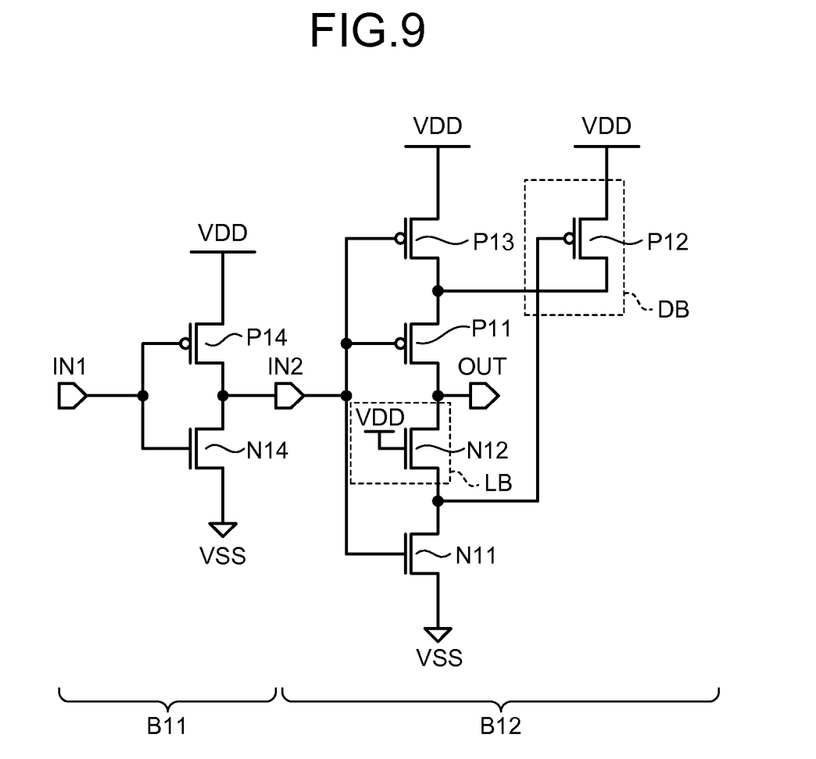
FIG. 9 is a circuit diagram of an exemplary configuration of a delay circuit applied to a semiconductor memory device according to a second embodiment.

FIG. 9 is a circuit diagram of an exemplary configuration of a delay circuit applied to a semiconductor memory device according to a second embodiment. It is noted that in the example in FIG. 9, the case is illustrated where a delay circuit is configured using inverters B11 and B12 in two stages. Moreover, in the example in FIG. 3, the configuration is illustrated in which the dependence of the delay time of the inverter B1 on characteristic fluctuations of the P-type transistors P1 and P2 is reduced. However, in the example in FIG. 9, the configuration is illustrated in which the dependence of the delay time of the inverter B11 on characteristic fluctuations of N-type transistors N11 and N12 is reduced.

In FIG. 9, the inverter B12 is provided with a load adjusting circuit LB and a driving force adjusting circuit DB. The load adjusting circuit LB is provided with the N-type transistor N12. The driving force adjusting circuit DB is provided with a P-type transistor P12. The load adjusting circuit LB can adjust a load in the pullup of the inverter circuit B12 based on the threshold voltage of the N-type transistor N12. The driving force adjusting circuit DB can adjust the driving force of the inverter circuit B12 based on the threshold voltage of the N-type transistor N12.

The gate potential of the N-type transistor N12 is set in such a way that the load charge amount of the inverter circuit B12 is adjusted, and the N-type transistor N12 can output an output signal OUT of the inverter circuit B12 from the drain. The source potential of the N-type transistor N12 is inputted to the gate of the P-type transistor P12. The N-type transistor N11 is connected in series to the source side of the N-type transistor N12, and the source of the N-type transistor N11 is set at the second potential VSS. A P-type transistor P11 is connected in series to the drain side of the N-type transistor N12, a P-type transistor P13 is connected in series to the source side of the P-type transistor P11, and the sources of the P-type transistors P12 and P13 are set at the first potential VDD. The gate of the N-type transistor N12 can be set at the first potential VDD. An input signal IN2 of the inverter circuit B12 is inputted to the gates of the N-type transistor N11 and the P-type transistors P11 and P13.

The inverter B11 is provided with a P-type transistor P14 and an N-type transistor N14. The P-type transistor P14 and the N-type transistor N14 are connected to each other in series. The source of the P-type transistor P14 is set at the first potential VDD, and the source of the N-type transistor N14 is set at the second potential VSS. An input signal IN1 of the inverter circuit B11 is inputted to the gates of the P-type transistor P14 and the N-type transistor N14. The input signal IN2 of the inverter circuit B12 is outputted from the drain of the P-type transistor P14.

In the case where the input signal IN1 is at low level, the input signal IN1 is inverted at the inverter B11, and the input signal IN2 of the inverter B12 is turned at high level. At this time, the N-type transistor N11 is turned on, and the P-type transistors P11 and P13 are turned off. Thus, the source potential of the N-type transistor N12 is set at the second potential VSS. Moreover, since the gate potential of the N-type transistor N12 is set at the first potential VDD, the N-type transistor N12 is turned on, and the output signal OUT of the inverter B12 is turned at low level.

When the input signal IN1 rises from low level to high level, the input signal IN1 is inverted at the inverter B11, and the input signal IN2 of the inverter B12 is turned at low level. At this time, the N-type transistor N11 is turned off, and the P-type transistors P11 and P13 are turned on. Thus, the drain potential of the N-type transistor N12 is pulled up through the P-type transistors P11 and P13, and the output signal OUT of the inverter B12 is turned at high level. Here, since the gate potential of the N-type transistor N12 is set at the first potential VDD, the N-type transistor N12 is turned on, and the source is charged by the charge amount q from the drain of the N-type transistor N12. The charge amount q can be given by q=C (VDD−Vtn), where the capacitance of a source node of the N-type transistor N12 is C, the threshold voltage of the N-type transistor N12 is Vtn, and the second potential VSS is the ground potential. Thus, when the threshold voltage Vtn of the N-type transistor N12 is low, the charge amount q charged in the pullup of the inverter B12 is increased, and the load of the inverter B12 is increased. As a result, when the threshold voltages Vtn of the N-type transistors N11 and N12 are reduced, the load in the pullup of the inverter B12 can be increased, and the dependence of the delay time of the inverter B12 on characteristic fluctuations of the N-type transistors N11 and N12 can be reduced, whereas the operations of the N-type transistors N11 and N12 become faster.

Moreover, since the gate potential of the P-type transistor P12 is set to the source potential of the N-type transistor N12, the gate potential of the P-type transistor P12 is increased, and the driving force of the P-type transistor P12 is reduced when the threshold voltage Vtn of the N-type transistor N12 is low. As a result, when the threshold voltages Vtn of the N-type transistors N11 and N12 are reduced, the driving force in the pullup of the inverter B12 can be reduced, and the dependence of the delay time of the inverter B12 on characteristic fluctuations of the N-type transistors N11 and N12 can be reduced, whereas the operations of the N-type transistors N11 and N12 become faster.

It is noted that in the example in FIG. 9, a method is described in which the delay circuit is configured using the inverters B11 and B12 in two stages. However, the delay circuit may be configured using only the inverter B12, or the delay circuit may be configured by alternately connecting the inverters B11 and B12 to each other in a plurality of stages.

Furthermore, the configuration in FIG. 3 is suited to an SRAM in which the bit lines BLt and BLc are in discharge from the state in which the bit lines BLt and BLc are in precharge according to data in the memory cell 12. On the other hand, the configuration of FIG. 9 is suited to an SRAM in which the bit lines BLt and BLc are in charge from the state in which the bit lines BLt and BLc are in discharge according to data in the memory cell 12.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A delay circuit comprising:
a first first-conductive type transistor configured to receive an input signal at a gate;
a second first-conductive type transistor connected in series to the first first-conductive type transistor, a gate potential of the second first-conductive type transistor being set so as to adjust a charge amount carried between a source and a drain;
a first second-conductive type transistor connected in series to the second first-conductive type transistor and configured to receive the input signal at a gate;
a second second-conductive type transistor connected in series to the first second-conductive type transistor and configured to receive a source potential of the second first-conductive type transistor at a gate; and
a third second-conductive type transistor connected in parallel with the second second-conductive type transistor and configured to receive the input signal at a gate.

2. The delay circuit according to claim 1, wherein the gate potential of the second first-conductive type transistor is set to a ground potential.

3. A delay circuit comprising:
an inverter circuit provided with a first conductive type transistor;
a load adjusting circuit configured to adjust a load of the inverter circuit based on a threshold voltage of the first conductive type transistor; and
a driving force adjusting circuit configured to adjust a driving force of the inverter circuit based on the threshold voltage of the first conductive type transistor.

4. The delay circuit according to claim 3, wherein:
the load adjusting circuit includes a first first-conductive type transistor whose gate potential is set so as to adjust a load charge amount of the inverter circuit, the first first-conductive type transistor being configured to output an output signal of the inverter circuit from a drain; and
the driving force adjusting circuit includes a first second-conductive type transistor configured to receive a source potential of the first first-conductive type transistor at a gate.

5. The delay circuit according to claim 4, wherein the inverter circuit includes a second first-conductive type transistor connected in series to the first first-conductive type transistor and configured to receive an input signal of the inverter circuit.

6. The delay circuit according to claim 5, wherein the inverter circuit includes a second second-conductive type transistor connected in series to the first first-conductive type transistor and configured to receive the input signal of the inverter circuit and output the output signal of the inverter circuit from a drain.

7. The delay circuit according to claim 6, wherein the inverter circuit includes a third second-conductive type transistor connected in parallel with the first second-conductive type transistor and configured to receive the input signal of the inverter circuit.

8. The delay circuit according to claim 3, wherein the inverter circuit provided with the load adjusting circuit and the driving force adjusting circuit, and an inverter circuit that is not provided with the load adjusting circuit and the driving force adjusting circuit are alternately connected to each other.

9. The delay circuit according to claim 3, wherein delay time does not depend on a characteristic fluctuation of the first conductive type transistor.

10. The delay circuit according to claim 3, wherein a load in a pulldown of the inverter circuit is increased and driving force is reduced when a threshold voltage of the first conductive type transistor is low as compared with when the threshold voltage of the first conductive type transistor is high.

11. A semiconductor memory device comprising:
a memory cell configured to complementarily store data;
a bit line configured to complementarily transmit a signal read out of the memory cell;

a sense amplifier circuit configured to detect data stored on the memory cell based on the signal transmitted through the bit line; and a timing control circuit configured to control timing of activating the sense amplifier circuit based on timing of reading out the signal to the bit line, wherein the timing control circuit includes a delay circuit configured to delay a sense amplifier enable signal to activate the sense amplifier circuit, the delay circuit including:

a load adjusting circuit configured to adjust a load of a first conductive type transistor based on a threshold voltage of the first conductive type transistor provided on an inverter circuit; and a driving force adjusting circuit configured to adjust a driving force of a second conductive type transistor provided on the inverter circuit based on the threshold voltage of the first conductive type transistor.

12. The semiconductor memory device according to claim 11, wherein a threshold voltage of the second conductive type transistor is equal to a threshold voltage of a second conductive type transistor of the memory cell.

13. The semiconductor memory device according to claim 11, wherein delay time of the delay circuit is determined by a characteristic of the second conductive type transistor, and the delay time does not depend on a characteristic fluctuation of the first conductive type transistor.

14. The semiconductor memory device according to claim 13, wherein the delay time of the delay circuit is set so that the sense amplifier circuit is activated after a voltage difference between the bit lines reaches a lowest voltage that the sense amplifier circuit is enabled to detect.

15. The semiconductor memory device according to claim 14, wherein a time period for which a voltage difference between the bit lines reaches a lowest voltage that the sense amplifier circuit is enabled to detect is determined by a characteristic of the second conductive type transistor of the memory cell, and the time period does not depend on a characteristic fluctuation of a first conductive type transistor of the memory cell.

16. The semiconductor memory device according to claim 11, wherein:

the load adjusting circuit includes a first first-conductive type transistor whose gate potential is set so as to adjust a load charge amount of the inverter circuit, the first first-conductive type transistor being configured to output an output signal of the inverter circuit from a drain; and the driving force adjusting circuit includes a first second-conductive type transistor configured to receive a source potential of the first first-conductive type transistor at a gate.

17. The semiconductor memory device according to claim 16, wherein the inverter circuit includes a second first-conductive type transistor connected in series to the first first-conductive type transistor and configured to receive an input signal of the inverter circuit.

18. The semiconductor memory device according to claim 17, wherein the inverter circuit includes a second second-conductive type transistor connected in series to the first first-conductive type transistor and configured to receive the input signal of the inverter circuit and output the output signal of the inverter circuit from a drain.

19. The semiconductor memory device according to claim 18, wherein the inverter circuit includes a third second-conductive type transistor connected in parallel with the first second-conductive type transistor and configured to receive the input signal of the inverter circuit.

20. The semiconductor memory device according to claim 11, wherein the inverter circuit provided with the load adjusting circuit and the driving force adjusting circuit, and an inverter circuit that is not provided with the load adjusting circuit and the driving force adjusting circuit are alternately connected to each other.

* * * * *